(12) United States Patent
Harada et al.

(10) Patent No.: US 11,545,304 B2
(45) Date of Patent: Jan. 3, 2023

(54) CAPACITOR CLUSTER HAVING CAPACITORS WITH DIFFERENT SHAPES

(71) Applicant: Murata Manufacturing Co., Ltd., Nagaokakyo (JP)

(72) Inventors: Masatomi Harada, Nagaokakyo (JP); Masaki Takeuchi, Nagaokakyo (JP); Takeshi Kagawa, Nagaokakyo (JP); Hiroshi Matsubara, Nagaokakyo (JP)

(73) Assignee: MURATA MANUFACTURING CO., LTD., Nagaokakyo (JP)

( * ) Notice: Subject to any disclaimer, the term of this patent is extended or adjusted under 35 U.S.C. 154(b) by 61 days.

(21) Appl. No.: 17/069,547

(22) Filed: Oct. 13, 2020

(65) Prior Publication Data
US 2021/0027951 A1      Jan. 28, 2021

Related U.S. Application Data

(63) Continuation of application No. PCT/JP2019/015622, filed on Apr. 10, 2019.

(30) Foreign Application Priority Data

Apr. 27, 2018 (JP) ............... JP2018-087212

(51) Int. Cl.
*H01G 4/38* (2006.01)
*H01G 4/002* (2006.01)
*H01L 49/02* (2006.01)

(52) U.S. Cl.
CPC ............ *H01G 4/38* (2013.01); *H01G 4/002* (2013.01); *H01L 28/40* (2013.01)

(58) Field of Classification Search
CPC . H01G 4/38; H01G 4/002; H01G 4/33; H01L 28/40
See application file for complete search history.

(56) References Cited

U.S. PATENT DOCUMENTS 6,159,752 A   12/2000 Katoh
8,351,185 B2   1/2013 Ohtsuka et al.
9,147,688 B2   9/2015 Saito
(Continued)

FOREIGN PATENT DOCUMENTS

JP    H0536828 U    5/1993
JP    H09321227 A   12/1997
(Continued)

OTHER PUBLICATIONS

Japanese Office Action issued for JP Patent Application No. 2020-516202, date of Office Action dated Apr. 5, 2022.
(Continued)

*Primary Examiner* — Nelson Garces
(74) *Attorney, Agent, or Firm* — ArentFox Schiff LLP

(57) ABSTRACT

A plurality of capacitors and a holding body constructed to hold the plurality of capacitors. Each of the plurality of capacitors includes a semiconductor substrate, a first electrode layer, a dielectric layer, a second electrode layer, and an outer electrode. Among a first capacitor and a second capacitor of the plurality of capacitors, the second capacitor has a shape different from a shape of the first capacitor in at least one of the first electrode layer, the second electrode layer, and the outer electrode.

15 Claims, 6 Drawing Sheets

(56) References Cited

U.S. PATENT DOCUMENTS

| | | | |
|---|---|---|---|
| 9,801,283 B2 | 10/2017 | Ogawa et al. | |
| 2002/0017730 A1* | 2/2002 | Tahara | H01L 27/0805 |
| | | | 257/E27.048 |
| 2011/0044011 A1 | 2/2011 | Ohtsuka et al. | |
| 2015/0026973 A1 | 1/2015 | Ogawa et al. | |
| 2015/0200197 A1* | 7/2015 | Saito | H01L 27/11502 |
| | | | 257/532 |
| 2019/0122820 A1 | 4/2019 | Harada et al. | |

FOREIGN PATENT DOCUMENTS

| | | | |
|---|---|---|---|
| JP | 2005170511 A | 6/2005 | |
| JP | 2011044613 A | 3/2011 | |
| JP | 2012015326 A | 1/2012 | |
| JP | 2015023245 A | 2/2015 | |
| JP | 2015133392 A | 7/2015 | |
| WO | 2018003445 A1 | 1/2018 | |

OTHER PUBLICATIONS

International Search Report issued for PCT/JP2019/015622, dated Jul. 2, 2019.
Written Opinion of the International Searching Authority issued for PCT/JP2019/015622, dated Jul. 2, 2019.

\* cited by examiner

US 11,545,304 B2

CAPACITOR CLUSTER HAVING CAPACITORS WITH DIFFERENT SHAPES

CROSS REFERENCE TO RELATED APPLICATIONS

The present application is a continuation of International application No. PCT/JP2019/015622, filed Apr. 10, 2019, which claims priority to Japanese Patent Application No. 2018-087212, filed Apr. 27, 2018, the entire contents of each of which are incorporated herein by reference.

FIELD OF THE INVENTION

The present invention relates to a capacitor cluster.

BACKGROUND OF THE INVENTION

Japanese Unexamined Patent Application Publication No. 2011-44613 (Patent Document 1) discloses a configuration of a capacitor included in a housing for a plurality of capacitors. The capacitor as an electronic component described in Patent Document 1 includes a circuit element formed on a substrate, an electrode layer connected to the circuit element, a protection layer covering the electrode layer, and a terminal electrode connected to the electrode layer through a via conductor penetrating through the protection layer and provided on the protection layer, and one end of the terminal electrode is positioned on the side wall of the protection layer.

Patent Document 1: Japanese Unexamined Patent Application Publication No. 2011-44613

SUMMARY OF THE INVENTION

A plurality of these capacitors are manufactured by forming a film on a wafer semiconductor substrate. Because of the variation in film thickness in film formation, stress distribution may occur in a plane of the wafer semiconductor substrate. Specifically, the larger the film thickness of the electrode layer, the larger the shrinkage amount in film formation, and the higher the generated stress. When the high stress acts on the electrode layer, cracks or peeling may occur. The capacitor in which the cracks or the peeling has occurred in the electrode layer becomes a defective product, and thus the yield of the capacitor that may be manufactured from the wafer semiconductor substrate is decreased. As a result, there is a negative effect in the ability to reduce the cost of the capacitor.

The present invention has been made in view of the above-described problem, and an object of the present invention is to provide a capacitor cluster leading to a cost reduction of the capacitor.

A capacitor cluster according to the present invention includes a plurality of capacitors and a holding body constructed to hold the plurality of capacitors. Each of the plurality of capacitors includes a semiconductor substrate having a main surface, a first electrode layer on a side of the main surface of the semiconductor substrate, a dielectric layer on the first electrode layer, a second electrode layer on the dielectric layer, a first outer electrode electrically connected to the first electrode layer, and a second outer electrode electrically connected to the second electrode layer. The plurality of capacitors includes a first capacitor and a second capacitor, and the second capacitor has a shape different from a shape of the first capacitor in at least one of the first electrode layer, the second electrode layer, the first outer electrode, and the second outer electrode.

According to the present invention, it is possible to reduce a cost of a capacitor.

DETAILED DESCRIPTION OF THE PREFERRED EMBODIMENTS

Figure 1:
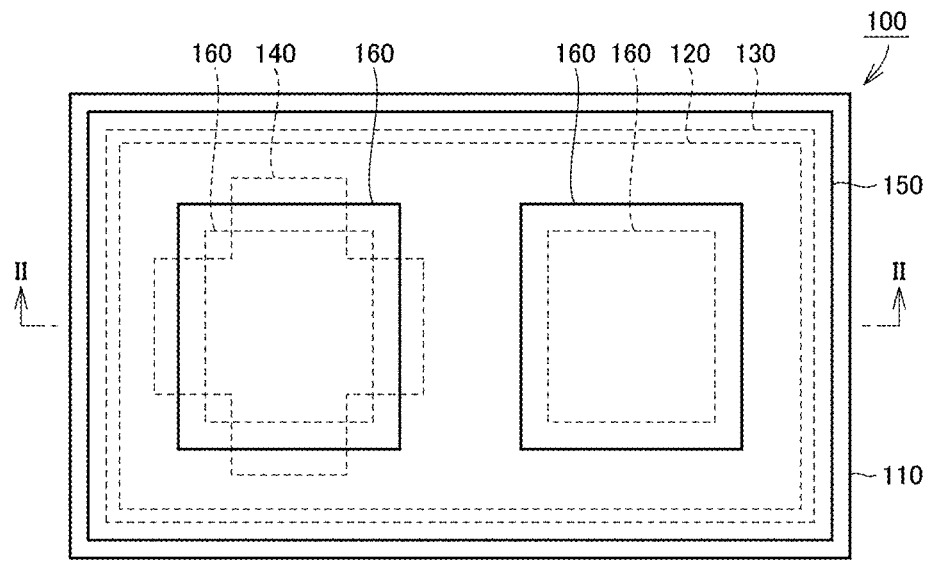
FIG. 1 is a plan view of an example of a capacitor among a plurality of capacitors included in a capacitor cluster according to Embodiment 1 of the present invention when viewed from an outer electrode side.

Hereinafter, a capacitor cluster according to each embodiment of the present invention will be described with reference to the drawings. In the following description of the embodiments, the same or corresponding portions in the drawings are denoted by the same reference numerals, and description thereof will not be repeated.

Embodiment 1

Figure 2:
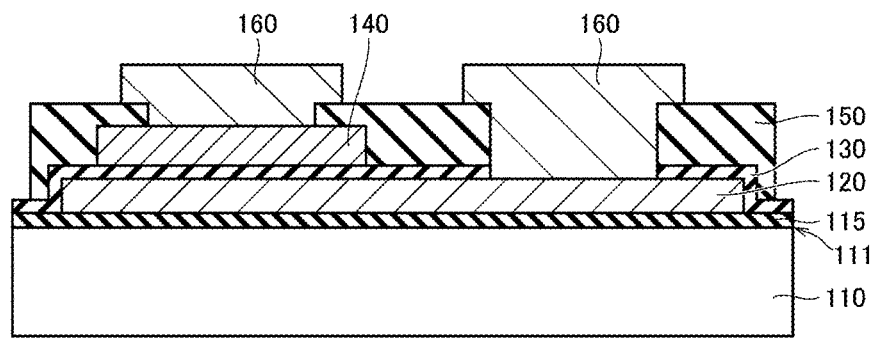
FIG. 2 is a sectional view of the capacitor in FIG. 1 when viewed from a direction of arrows along a line II-II.

FIG. 1 is a plan view of an example of a capacitor among a plurality of capacitors included in a capacitor cluster according to Embodiment 1 of the present invention when viewed from an outer electrode side. FIG. 2 is a sectional view of the capacitor in FIG. 1 when viewed from a direction of arrows along a line II-II.

As illustrated in FIG. 1 and FIG. 2, each of a plurality of capacitors 100 included in the capacitor cluster according to Embodiment 1 of the present invention includes a semiconductor substrate 110, a first electrode layer 120, a dielectric layer 130, a second electrode layer 140, and an outer electrode 160. Note that the respective structures and shapes of the first electrode layer 120, the second electrode layer 140, and the outer electrode 160 are not limited to the structures and shapes illustrated in FIG. 1 and FIG. 2.

The semiconductor substrate 110 has one main surface 111. As illustrated in FIG. 1, the semiconductor substrate 110 has a rectangular outer shape and two long sides in a direction in which two outer electrodes 160 are placed side by side when viewed from an outer electrode 160 side. The rectangular shape has long sides having a length of 200 μm to 600 μm and short sides having a length of 100 μm to 300 μm, for example. In the present embodiment, the semiconductor substrate 110 is made of a semiconductor material such as silicon. Instead of the semiconductor substrate 110, an insulation substrate made of an insulation material such as glass or alumina may be used.

In the present embodiment, as illustrated in FIG. 2, each of the plurality of capacitors 100 further includes an insulation layer 115. The insulation layer 115 is laminated over the entire surface of the one main surface 111 of the semiconductor substrate 110. The insulation layer 115 may have a plurality of layers each of which is formed of a different material.

The thickness of the insulation layer 115 is not particularly limited as long as the insulation layer 115 is capable of electrically insulating the semiconductor substrate 110 from other constituent members. The thickness of the insulation layer is preferably 0.5 μm to 3 μm. The material of the insulation layer 115 is not particularly limited, but the insulation layer 115 is preferably made of silicon oxide, silicon nitride, aluminum oxide, or the like.

Note that when an insulation substrate is used instead of the semiconductor substrate 110, the capacitor 100 may not include the insulation layer 115. When the capacitor 100 does not include the insulation layer 115, a member laminated on the insulation layer 115 when the capacitor 100 includes the insulation layer 115 is directly laminated on the insulation substrate.

The first electrode layer 120 is positioned on the one main surface 111 side of the semiconductor substrate 110. In the present embodiment, the first electrode layer 120 is laminated on part of the insulation layer 115 that is laminated on the semiconductor substrate 110. As illustrated in FIG. 1, when the capacitor 100 is viewed from the outer electrode side, the peripheral edge of the first electrode layer 120 is positioned along an inner side of the peripheral edge of the semiconductor substrate 110. The first electrode layer 120 may include a plurality of layers each of which is formed of a different material.

The thickness of the first electrode layer 120 is not particularly limited, but is preferably 0.3 μm to 10 μm, and more preferably 0.5 μm to 5 μm. When the thickness of the first electrode layer 120 is relatively large, it is possible to reduce the series resistance of the capacitor 100.

The material of the first electrode layer 120 is not particularly limited as long as the material is a conductive material, and it is preferable that the first electrode layer 120 be made of a metal such as copper, silver, gold, aluminum, nickel, chromium or titanium, or an alloy containing at least one of the metals above.

The dielectric layer 130 is laminated on the first electrode layer 120. As illustrated in FIG. 2, the dielectric layer 130 is laminated on the insulation layer 115 such that the dielectric layer 130 extends also to a portion where the first electrode layer 120 is not laminated.

The thickness of the dielectric layer 130 is adjusted in accordance with an electrostatic capacitance required for the plurality of capacitors 100. The thickness of the dielectric layer 130 is not particularly limited, but is preferably 0.02 μm to 2 μm.

The material of the dielectric layer 130 is not particularly limited, but it is preferable that the dielectric layer 130 be made of a material having dielectric property and insulation property such as an oxide or a nitride including silicon oxide, silicon nitride, aluminum oxide, hafnium oxide, tantalum oxide, zirconium oxide, or the like.

As illustrated in FIG. 2, the second electrode layer 140 is laminated on part of the dielectric layer 130 so as to face the first electrode layer 120 with the dielectric layer 130 interposed therebetween. The shape of the second electrode layer 140 when the capacitor 100 is viewed from the outer electrode 160 side has a cross shape in FIG. 1, but the shape of the second electrode layer 140 in the present embodiment is not limited thereto. Details of the shape of the second electrode layer 140 in the present embodiment will be described later.

The thickness of the second electrode layer 140 is not particularly limited, but is preferably 0.3 μm to 10 μm, and more preferably 0.5 μm to 5 μm. When the thickness of the second electrode layer 140 is relatively large, it is possible to reduce the series resistance of the capacitor 100.

The material of the second electrode layer 140 is not particularly limited as long as being a conductive material, but it is preferable that the second electrode layer 140 be made of a metal such as copper, silver, gold, aluminum, nickel, chromium, or titanium, or an alloy containing at least one of the metals above.

In the present embodiment, each of the plurality of capacitors 100 further includes a protection layer 150. As illustrated in FIG. 1, when the capacitor 100 is viewed from the outer electrode 160 side, the peripheral edge of the protection layer 150 is positioned between the peripheral edge of the semiconductor substrate 110 and the peripheral edge of the first electrode layer 120 along each peripheral edge. As illustrated in FIG. 2, the protection layer 150 is laminated on part of the dielectric layer 130 in the opposite side of the semiconductor substrate and on part of the second electrode layer 140.

The thickness of the protection layer 150 is not particularly limited, but is preferably 1 μm to 20 μm. The material of the protection layer 150 is not particularly limited, but it is preferable that the protection layer 150 be made of a resin material such as polyimide, or an insulation material such as silicon oxide.

First and second outer electrodes 160 are correspondingly connected to each of the first electrode layer 120 and the second electrode layer 140. As illustrated in FIG. 2, the outer electrode 160 connected to the first electrode layer 120 is laminated on a portion of the first electrode layer 120 where the dielectric layer 130 is not laminated. The outer electrode 160 connected to the second electrode layer 140 is laminated on a portion of the second electrode layer 140 where the protection layer 150 is not laminated. Note that, between the second electrode layer 140 and the outer electrode 160 laminated thereon, another electrode layer made of a material that is different from the material of the second electrode layer 140 may be positioned.

The outer electrodes 160 are also laminated on part of the protection layer 150. As illustrated in FIG. 1, when the capacitor 100 is viewed from the outer electrode side, the outer electrode 160 laminated on the first electrode layer 120 is surrounded by the outer electrode 160 laminated on part of the protection layer 150, and the outer electrode 160 laminated on the second electrode layer 140 is surrounded by the outer electrode 160 laminated on part of the protection layer 150.

The thickness of the outer electrodes 160 is not particularly limited, but is preferably 1 μm to 10 μm. The material of the outer electrodes 160 is not particularly limited as long as being a conductive material, and it is preferable that the outer electrodes 160 be made of a metal such as copper or aluminum, or an alloy containing at least one of the metals above. The material forming the outer electrodes 160 is preferably a material in which electrical resistivity is lower than those of the first electrode layer 120 and the second electrode layer 140. In view of the fact that the capacitor 100 may be mounted by soldering, it is preferable that at least part of the surface of the outer electrodes 160 in the opposite side of the semiconductor substrate be made of gold or tin.

Hereinafter, a manufacturing method of the capacitor 100 illustrated in FIG. 1 and FIG. 2 will be described.

Figure 3:
FIG. 3 is a sectional view illustrating a state in which an insulation layer is provided on one main surface of a semiconductor substrate in a manufacturing method of the capacitor in FIG. 1.

FIG. 3 is a sectional view illustrating a state in which an insulation layer is provided on one main surface of the semiconductor substrate in the manufacturing method of the capacitor in FIG. 1. As illustrated in FIG. 3, the insulation layer 115 is provided on the one main surface 111 of the semiconductor substrate 110 by a chemical vapor deposition (CVD) process, a physical vapor deposition (PVD) process, or the like.

Figure 4:
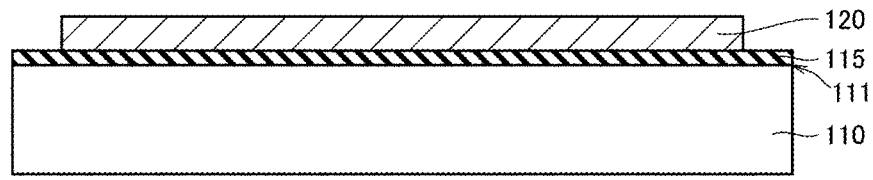
FIG. 4 is a sectional view illustrating a state in which a first electrode layer is provided on the insulation layer in the manufacturing method of the capacitor in FIG. 1.

FIG. 4 is a sectional view illustrating a state in which a first electrode layer is provided on the insulation layer in the manufacturing method of the capacitor in FIG. 1. As illustrated in FIG. 4, the first electrode layer 120 is provided on the insulation layer 115 in the opposite side of the semiconductor substrate by etching process or the like. That is, the first electrode layer 120 is provided on the one main surface side of the semiconductor substrate 110.

Figure 5:
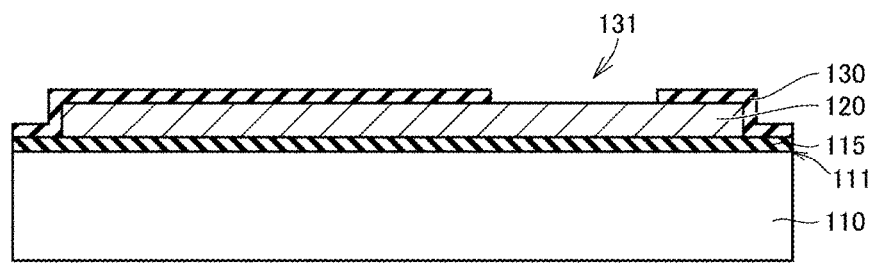
FIG. 5 is a sectional view illustrating a state in which a dielectric layer is provided on the first electrode layer in the manufacturing method of the capacitor in FIG. 1.

FIG. 5 is a sectional view illustrating a state in which a dielectric layer is provided on the first electrode layer in the manufacturing method of the capacitor in FIG. 1. As illustrated in FIG. 5, by the CVD process, the PVD process, or the like, the dielectric layer 130 is formed on the entire surface of the first electrode layer 120 in the opposite side of the semiconductor substrate, on the peripheral edge of the first electrode layer 120, and on the surface of the insulation layer 115 in the opposite side of the semiconductor substrate where the first electrode layer 120 is not provided. After the formation of the dielectric layer 130, a through-hole 131 is formed in the dielectric layer 130 by etching of part of the dielectric layer 130.

Figure 6:
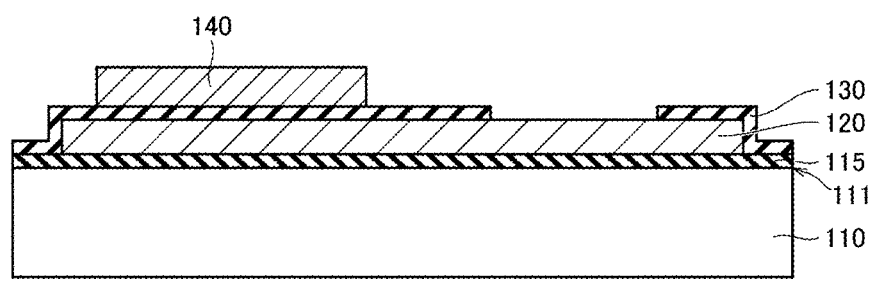
FIG. 6 is a sectional view illustrating a state in which a second electrode layer is provided on the dielectric layer in the manufacturing method of the capacitor in FIG. 1.

FIG. 6 is a sectional view illustrating a state in which the second electrode layer is provided on the dielectric layer in the manufacturing method of the capacitor in FIG. 1. As illustrated in FIG. 6, the second electrode layer 140 is provided on part of the dielectric layer 130 in the opposite side of the semiconductor substrate by etching process or the like.

Figure 7:
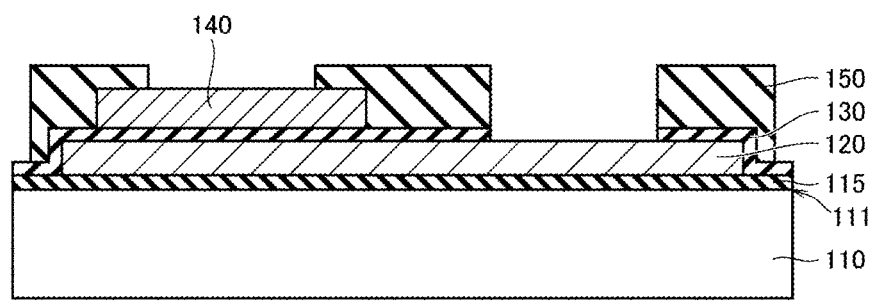
FIG. 7 is a sectional view illustrating a state in which a protection layer is provided in the manufacturing method of the capacitor in FIG. 1.

FIG. 7 is a sectional view illustrating a state in which a protection layer is provided in the manufacturing method of the capacitor in FIG. 1. As illustrated in FIG. 7, patterning is carried out on the protection layer 150 provided so as to cover the one main surface 111 side of the semiconductor substrate 110 by photolithography such that part of the first electrode layer 120 and the second electrode layer 140 each are exposed.

Next, the outer electrodes are provided so as to be connected to each of the first electrode layer 120 and the second electrode layer 140 by sputtering process, plating process, etching process, or the like. The capacitor 100 as illustrated in FIG. 1 and FIG. 2 is manufactured by steps above.

Hereinafter, a description will be given of a first capacitor and a second capacitor included in a plurality of capacitors included in the capacitor cluster according to Embodiment 1 of the present invention. Note that, in the following description of FIG. 8, a capacitor having a single second region is described instead of the capacitor 100 having two second regions which will be described later in order to simplify the description.

Figure 8:
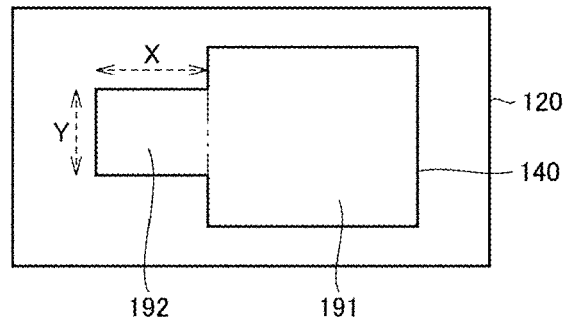
FIG. 8 is a plan view of a first capacitor among the plurality of capacitors included in the capacitor cluster according to Embodiment 1 of the present invention when viewed from the outer electrode side.

FIG. 8 is a plan view of a first capacitor among the plurality of capacitors included in the capacitor cluster according to Embodiment 1 of the present invention when viewed from the outer electrode side. In FIG. 8, only the shapes of the first electrode layer 120 and the second electrode layer 140 each are illustrated.

As illustrated in FIG. 8, in the first capacitor according to the present embodiment, when viewed from the outer electrode 160 side, the second electrode layer 140 has a first region 191 having a rectangular shape and the maximum area and a single second region 192 that protrudes from the first region 191. The first region 191 has two long sides and two short sides.

The second region 192 is provided so as to protrude from part of one side of the two long sides of the first region 191. Note that the second region may protrude from any position of the long side of the first region 191. Alternatively, the second region 192 may be provided so as to protrude from part of one side of the two short sides of the 191. In the present embodiment, the second region 192 has a rectangular shape, but the present invention is not limited thereto. The second region 192 may have a triangular shape, a fan-like shape, or the like.

In the rectangular shape of the second region 192, the length of the side parallel to the direction in which the second region 192 protrudes from the first region is X, and the length of the other side orthogonal to this side is Y.

Among the plurality of capacitors included in the capacitor cluster according to Embodiment 1 of the present invention, the second capacitor is different from the first capacitor in at least one of the length X and the length Y, and is the same in other configurations. That is, the first capacitor and the second capacitor are different from each other in shape in the second region 192.

In the present embodiment, the second capacitor has a shape different from that of the first capacitor in the second electrode layer 140. Further, in the present embodiment, the first capacitor and the second capacitor have areas different from each other in the second electrode layer 140 when viewed from the outer electrode 160 side.

Here, the reason why the plurality of capacitors included in the capacitor cluster according to Embodiment 1 of the present invention includes the first capacitor and the second capacitor will be described.

Figure 9:
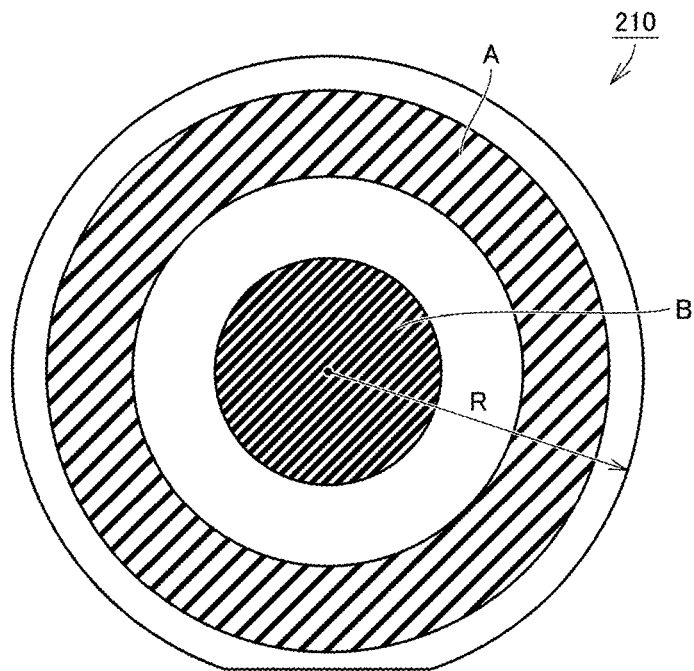
FIG. 9 is a diagram illustrating an example of a stress distribution in a plane of the wafer semiconductor substrate when a film is formed on a wafer semiconductor substrate.

The plurality of capacitors is manufactured by forming films on a wafer semiconductor substrate. FIG. 9 is a diagram illustrating an example of a stress distribution in a plane of a wafer semiconductor substrate when films are formed on a wafer semiconductor substrate.

As illustrated in FIG. 9, a wafer semiconductor substrate 210 has a substantially circular outer shape. Each layer constituting the capacitor 100 is formed on the wafer semiconductor substrate 210. Because of the variation in film thickness in film formation, the stress distribution may occur in the plane of the wafer semiconductor substrate 210. In particular, when the film thickness of at least one of the first electrode layer 120, the second electrode layer 140, and the outer electrode 160 having a large coefficient of thermal expansion varies, a stress distribution is generated in the plane of the wafer semiconductor substrate 210.

For example, when the film thickness of the second electrode layer 140 is relatively small in a region A positioned in the outer peripheral portion of the wafer semiconductor substrate 210 and relatively large in a region B positioned in the central portion of the wafer semiconductor substrate 210, the stress in the plane of the wafer semiconductor substrate 210 decreases toward the outer side R along the radial direction.

In addition, when the film thickness of the second electrode layer 140 is relatively large in the region A positioned in the outer peripheral portion of the wafer semiconductor substrate 210 and relatively small in the region B positioned in the central portion of the wafer semiconductor substrate 210, the stress in the plane of the wafer semiconductor substrate 210 increases toward the outer side R along the radial direction.

Note that in the wafer semiconductor substrate 210 illustrated in FIG. 9, the region A has an annular outer shape, and the region B has a circular outer shape. In addition, on the wafer semiconductor substrate 210, each of the region A and the region B is concentrically positioned with the wafer semiconductor substrate 210. Note that each of the region A and the region B is not necessarily concentrically positioned with the wafer semiconductor substrate 210.

When a plurality of capacitors are manufactured from the wafer semiconductor substrate 210 in which the stress distribution is generated as described above, high stress acts on the electrode layers of the capacitors cut out from the portion having high stress in the plane of the wafer semiconductor substrate 210, and cracks or peeling may occur.

Therefore, in the present embodiment, the shapes of the second regions 192 are made different in accordance with the stress distribution in the plane of the wafer semiconductor substrate 210. For example, when the first capacitor is cut out from a portion having a high stress in the plane of the wafer semiconductor substrate 210, and the second capacitor is cut out from a portion having a low stress in the plane of the wafer semiconductor substrate 210, the shape of the second region 192 of the first capacitor and the shape of the second region 192 of the second capacitor are made different from each other such that the area of the second region 192 of the first capacitor is smaller than the area of the second region 192 of the second capacitor.

With this, since the stress acting on the electrode layer of the first capacitor cut out from the portion having high stress in the plane of the wafer semiconductor substrate 210 may be relieved, it is possible to suppress the occurrence of cracks or peeling in the first capacitor.

Note that the stress distribution in the plane of the wafer semiconductor substrate 210 illustrated in FIG. 9 is a stress distribution when films are formed such that all capacitors has the same structure. When manufacturing the plurality of capacitors 100 according to the present embodiment, the shape and the area of each of the second regions 192 are set based on the tendency of the stress distribution identified in advance.

In addition, the present invention is not limited to the case where the shape of the single second region 192 is changed. It is possible to relieve the stress acting on the electrode layers of the capacitors by appropriately changing the number and the arrangement of the second regions 192 in accordance with the stress distribution in the plane of the wafer semiconductor substrate 210.

Further, in the present embodiment, in a case where the thickness of the dielectric layer 130 is different from each other in the first capacitor and the second capacitor, the size of the second electrode layer 140 is appropriately changed. For example, the shape of the second region 192 of the first capacitor and the shape of the second region 192 of the second capacitor are made different from each other such that one of the first capacitor and the second capacitor in which the dielectric layer 130 is thick is larger in the area of the second electrode layer 140 when viewed from the outer electrode 160 side as compared with the other of the first capacitor and the second capacitor in which the dielectric layer 130 is thin. With this, it is possible to reduce the difference between the electrostatic capacitance of the first capacitor and the electrostatic capacitance of the second capacitor because of the variation in the film thickness of the dielectric layer 130.

Figure 10:
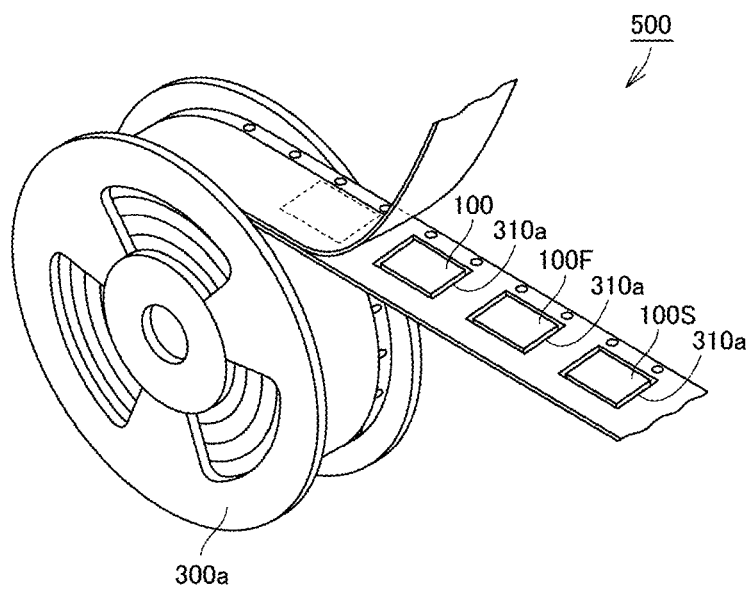
FIG. 10 is a perspective view illustrating a configuration of the capacitor cluster according to Embodiment 1 of the present invention.

FIG. 10 is a perspective view illustrating a configuration of the capacitor cluster according to Embodiment 1 of the present invention. As illustrated in FIG. 10, a capacitor cluster 500 according to Embodiment 1 of the present invention includes the plurality of capacitors 100 and a holding body for holding the plurality of capacitors 100. The plurality of capacitors 100 includes first capacitors 100F and second capacitors 100S.

The plurality of capacitors 100 may further include other capacitors having different shapes in at least one of the first electrode layer 120, the second electrode layer 140, and the outer electrode 160 from each of the first capacitor 100F and the second capacitor.

The holding body according to the present embodiment is constituted of a tape reel 300a. The tape reel 300a is provided with a plurality of pockets 310a. The plurality of capacitors 100 including the first capacitors 100F and the second capacitors 100S are housed in each of the plurality of pockets 310a.

Note that the holding body is not limited to the tape reel 300a. Here, another aspect of the capacitor cluster in which only the holding body is different will be described.

Figure 11:
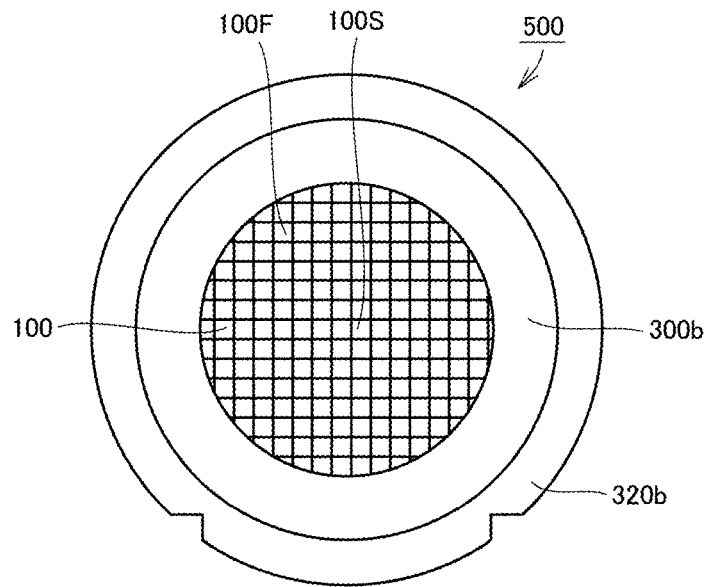
FIG. 11 is a plan view illustrating a capacitor cluster in which a holding body is a dicing tape as another example of the capacitor cluster according to the present embodiment.

FIG. 11 is a plan view illustrating a capacitor cluster in which the holding body is a dicing tape as another example of the capacitor cluster according to the present embodiment. As illustrated in FIG. 11, as the holding body for holding the plurality of capacitors 100, there may be used a dicing tape 300b which is attached to the wafer semiconductor substrate 210 when the wafer semiconductor substrate 210 is cut with a dicing machine. In this case, the capacitor cluster 500 further includes a dicing ring 320b which is disposed on the outer periphery of the wafer semiconductor substrate 210 and to which the dicing tape 300b is attached. The dicing tape 300b is not cut even after cutting with a dicing machine, and it is possible to hold the plurality of capacitors 100.

Figure 12:
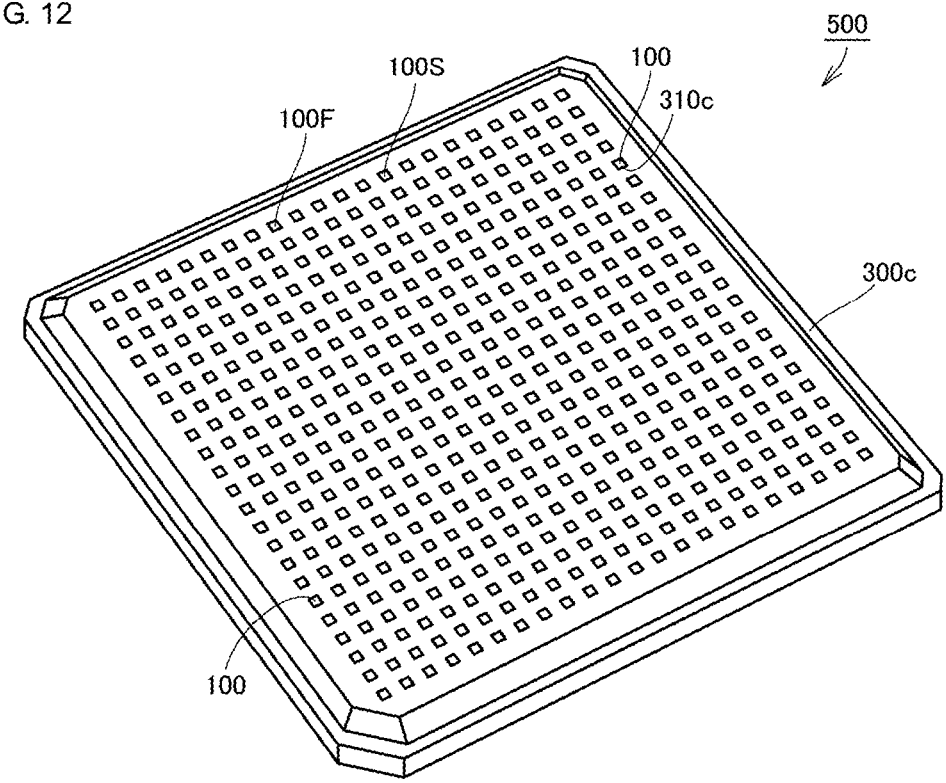
FIG. 12 is a perspective view illustrating a capacitor cluster in which a holding body is a chip tray as still another example of the capacitor cluster according to the present embodiment.

FIG. 12 is a perspective view illustrating a capacitor cluster in which the holding body is a chip tray as still another example of the capacitor cluster according to the present embodiment. As illustrated in FIG. 12, a chip tray 300c may be used as a holding body that holds the plurality of capacitors 100. The chip tray 300c is provided with a plurality of pockets 310c. The plurality of capacitors 100 including the first capacitor 100F and the second capacitor 100S are housed in each of the plurality of pockets 310c.

As described above, the capacitor cluster 500 according to the present embodiment includes the plurality of capacitors 100 including the first capacitors 100F and the second capacitors 100S that are different from each other in shape in the second electrode layer 140 in accordance with the stress distribution in the plane of the wafer semiconductor substrate 210. With this, it is possible to suppress occurrence of cracks or peeling in the capacitors cut out from the portion having high stress in the plane of the wafer semiconductor substrate 210, and thus it is possible to reduce the defect rate of the capacitor and improve the yield of the capacitor that may be manufactured from the wafer semiconductor substrate. As a result, it is possible to reduce the cost of the capacitor.

Here, the capacitor cluster according to each modification of Embodiment 1 of the present invention, in which the arrangement or the number of the second regions is different, will be described.

Figure 13:
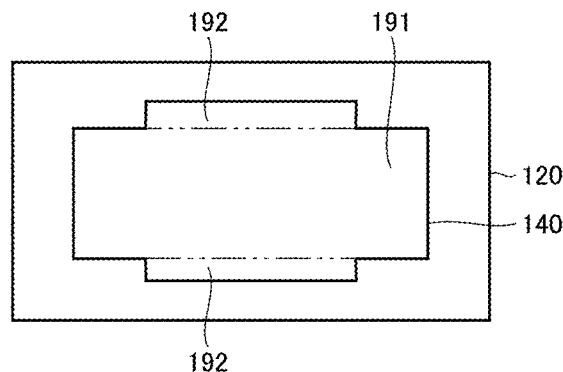
FIG. 13 is a plan view of a capacitor included in a capacitor cluster according to Modification 1 of Embodiment 1 of the present invention when viewed from the outer electrode side.

FIG. 13 is a plan view of a capacitor included in a capacitor cluster according to Modification 1 of Embodiment 1 of the present invention when viewed from the outer electrode side. In FIG. 13, only a shape of each of the first electrode layer 120 and the second electrode layer 140 is illustrated.

As illustrated in FIG. 13, in the capacitor according to Modification 1, the second electrode layer 140 has the first region 191 having a rectangular shape and the maximum area and two second regions 192 protruding from the first region 191 when viewed from the outer electrode 160 side. The second region 192 protrudes in a direction along the short side of the first electrode layer 120.

Figure 14:
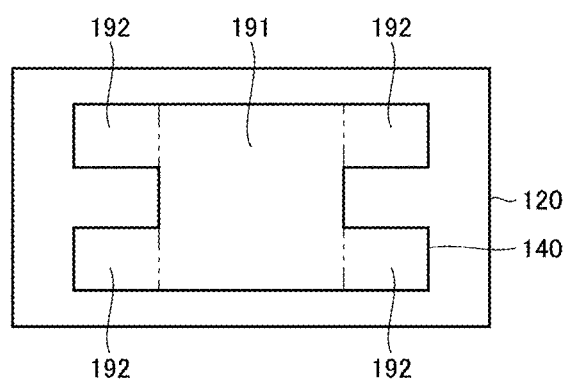
FIG. 14 is a plan view of a capacitor included in a capacitor cluster according to Modification 2 of Embodiment 1 of the present invention when viewed from the outer electrode side.

FIG. 14 is a plan view of a capacitor included in a capacitor cluster according to Modification 2 of Embodiment 1 of the present invention when viewed from the outer electrode side. In FIG. 14, only a shape of each of the first electrode layer 120 and the second electrode layer 140 is illustrated.

As illustrated in FIG. 14, in the capacitor according to Modification 2, the second electrode layer 140 has the first region 191 having a rectangular shape and the maximum area and four second regions 192 protruding from the first region 191 when viewed from the outer electrode 160 side. The second region 192 is provided such that the two second regions 192 protrude from each one of the two long sides of the first region 191.

Further, the two second regions 192 that protrude from one long side of the first region 191 are provided so as to face the other two second regions 192 with the first region 191 interposed therebetween, respectively. That is, in the present modification, the second electrode layer 140 has an H-shape. Note that the four second regions 192 may be provided at positions different from each other in a direction parallel to the long side of the first region 191.

In the present embodiment, the shapes of the second regions are made different from each other in the first capacitor and the second capacitor, but the shapes of the first regions may be made different from each other.

Embodiment 2

Hereinafter, a capacitor cluster according to Embodiment 2 of the present invention will be described. The capacitor cluster according to Embodiment 2 of the present invention differs from the capacitor cluster 500 according to Embodiment 1 of the present invention in that the first capacitor 100F and the second capacitor 100S are different from each other in shape in the first electrode layer 120. Therefore, the description of the configuration similar to that of the capacitor cluster 500 according to Embodiment 1 of the present invention will not be repeated.

Figure 15:
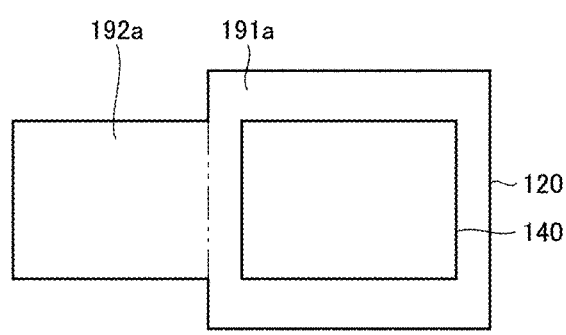
FIG. 15 is a plan view of a capacitor included in a capacitor cluster according to Embodiment 2 of the present invention when viewed from the outer electrode side.

FIG. 15 is a plan view of a capacitor included in the capacitor cluster according to Embodiment 2 of the present invention when viewed from the outer electrode side. In FIG. 15, only a shape of each of the first electrode layer 120 and the second electrode layer 140 is illustrated.

As illustrated in FIG. 15, in the capacitor according to Embodiment 2 of the present invention, the first electrode layer 120 has a first region 191a having a rectangular shape and the maximum area and a single second region 192a protruding from the first region 191 when viewed from the outer electrode 160 side. The shape of each of the first region 191a and the second region 192a in the present embodiment may be set similarly to the shape of each of the first region 191 and the second region 192 in Embodiment 1.

Further, since the second electrode layer 140 is positioned inside the first electrode layer 120 when viewed from the outer electrode 160 side, it is possible to reduce the parasitic capacitance generated between the outer electrode 160 and the first electrode layer 120.

In the present embodiment, the first capacitor 100F and the second capacitor 100S are different from each other in shape in the first electrode layer 120, and thus, the stress in the first electrode layer 120 among the layers constituting each of the plurality of capacitors 100 may be selectively relieved. Therefore, it is possible to more effectively increase the yield of the capacitor manufactured from the same wafer semiconductor substrate, and thus, it is possible to reduce the cost of the capacitor constituting the capacitor cluster.

In the present embodiment, two or more second regions 192a may protrude from the single first region 191a in the first electrode layer 120. Further, the first capacitor 100F and the second capacitor 100S may be different from each other in shape in the second electrode layer 140. Here, the capacitor cluster 500 according to each modification of Embodiment 2 of the present invention will be described.

Figure 16:
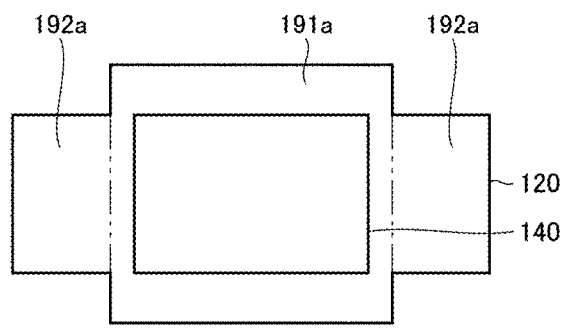
FIG. 16 is a plan view of a capacitor included in a capacitor cluster according to Modification 1 of Embodiment 2 of the present invention when viewed from the outer electrode side.

FIG. 16 is a plan view of a capacitor included in a capacitor cluster according to Modification 1 of Embodiment 2 of the present invention when viewed from the outer electrode side. In FIG. 16, only a shape of each of the first electrode layer 120 and the second electrode layer 140 is illustrated.

As illustrated in FIG. 16, in the capacitor according to Modification 1 of Embodiment 2 of the present invention, the first electrode layer 120 has the first region 191a having a rectangular shape and the maximum area and the two second regions 192a protruding from the first region 191a when viewed from the outer electrode 160 side. The second region 192a is provided so as to protrude from part of each of the two long sides of the first region 191a.

The shape of each of the first region 191a and the second region 192a in the present modification may be set similarly to the shape of each of the first region 191 and the second region 192 in Modification 1 of the Embodiment 1.

Figure 17:
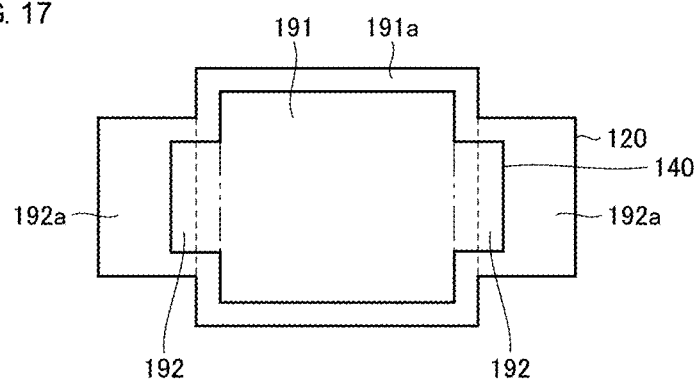
FIG. 17 is a plan view of a capacitor included in a capacitor cluster according to Modification 2 of Embodiment 2 of the present invention when viewed from the outer electrode side.

FIG. 17 is a plan view of a capacitor included in a capacitor cluster according to Modification 2 of Embodiment 2 of the present invention when viewed from the outer electrode side. In FIG. 17, only a shape of each of the first electrode layer 120 and the second electrode layer 140 is illustrated.

As illustrated in FIG. 17, in the capacitor according to Modification 2 of Embodiment 2 of the present invention, the second electrode layer 140 has the first region 191 having a rectangular shape and the maximum area and the two second regions 192 that protrude from the first region 191 when viewed from the outer electrode 160 side. The second region 192 is provided so as to protrude from part of each of the two long sides of the first region 191.

Further, when viewed from the outer electrode 160 side, the first region 191 of the second electrode layer 140 may be provided over the first region 191a of the first electrode layer 120 as illustrated in FIG. 17, or may be provided to be positioned inside the first region 191a of the first electrode layer 120.

The shape of each of the first region 191 and the second region 192 in the present modification may be set similarly to the shape of each of the first region 191 and the second region 192 in Modification 2 of Embodiment 1.

Embodiment 3

Hereinafter, a capacitor cluster according to Embodiment 3 of the present invention will be described. The capacitor cluster according to Embodiment 3 of the present invention differs from the capacitor cluster 500 according to Embodiment 1 of the present invention in that the first capacitor 100F and the second capacitor 100S are different from each other in shape in the outer electrode 160. Therefore, the description of the configuration similar to that of the capacitor cluster 500 according to Embodiment 1 of the present invention will not be repeated.

Figure 18:
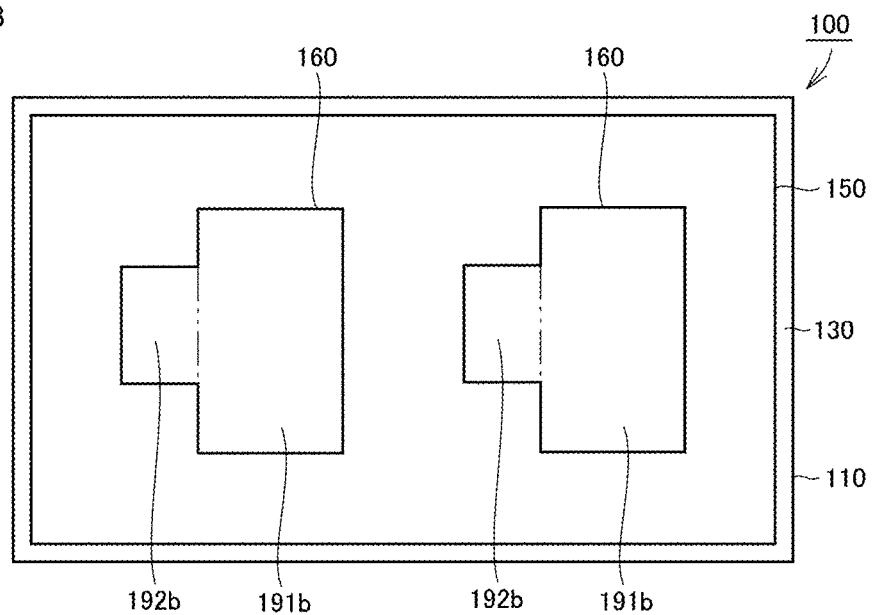
FIG. 18 is a plan view of a capacitor included in a capacitor cluster according to Embodiment 3 of the present invention when viewed from the outer electrode side.

FIG. 18 is a plan view of a capacitor included in the capacitor cluster according to Embodiment 3 of the present invention when viewed from the outer electrode side. In FIG. 18, the internal structure of the capacitor is not illustrated.

As illustrated in FIG. 18, in the capacitor according to Embodiment 3 of the present invention, at least one of the outer electrodes 160 has a first region 191b having a rectangular shape and the maximum area and one second region 192b protruding from the first region 191b when viewed from the outer electrode 160 side. Note that, in the present embodiment, all of the outer electrodes 160 have the first region 191b and the second region 192b.

The shape of each of the first region 191b and the second region 192b in the present embodiment may be set similarly to the shape of each of the first region 191 and the second region 192 in Embodiment 1.

In the present embodiment, the first capacitor 100F and the second capacitor 100S are different from each other in shape in the outer electrode 160, and thus, the stress in the outer electrode 160 among the layers constituting the plurality of capacitors 100 may be selectively relieved. Therefore, it is possible to more effectively increase the yield of the capacitor manufactured from the same wafer semiconductor substrate, and thus, it is possible to reduce the cost of the capacitor constituting the capacitor cluster.

In the description of the above-described embodiments, the various configurations may be combined with each other. That is, in the capacitor cluster 500, it is sufficient that the first capacitor 100F and the second capacitor 100S have different shapes from each other in at least one of the first electrode layer 120, the second electrode layer 140, and the outer electrode 160.

Also, the first capacitor 100F and the second capacitor 100S may have areas different from each other in at least one of the first electrode layer 120, the second electrode layer 140, and the outer electrode 160 when viewed from the outer electrode 160 side.

Further, the first capacitor 100F and the second capacitor 100S may have different thicknesses from each other in the dielectric layer 130. When the thickness of the dielectric layer 130 of the first capacitor 100F in the laminating direction is larger than the thickness of the dielectric layer 130 of the second capacitor 100S, it is sufficient that the area of at least one of the first electrode layer 120, the second electrode layer 140, and the outer electrode 160 of the first capacitor 100F be larger than the area of at least one of the first electrode layer 120, the second electrode layer 140, and the outer electrode 160 of the second capacitor 100S corresponding thereto.

In this case, it is acceptable that the area of the first electrode layer 120 of the first capacitor 100F is larger than the area of the first electrode layer 120 of the second capacitor 100S, or the area of the second electrode layer 140 of the first capacitor 100F is larger than the area of the second electrode layer 140 of the second capacitor 100S.

It should be understood that the embodiments disclosed herein are illustrative in all respects and are not restrictive. The scope of the present invention is indicated by the appended claims rather than by the above description, and it is intended that all modifications within the meaning and scope equivalent to those of the claims are included.

REFERENCE SIGNS LIST

100 CAPACITOR
100F FIRST CAPACITOR
100S SECOND CAPACITOR
110 SEMICONDUCTOR SUBSTRATE
111 MAIN SURFACE
115 INSULATION LAYER
120 FIRST ELECTRODE LAYER
130 DIELECTRIC LAYER
131 THROUGH-HOLE
140 SECOND ELECTRODE LAYER
150 PROTECTION LAYER
160 OUTER ELECTRODE
191, 191a, 191b FIRST REGION
192, 192a, 192b SECOND REGION
210 WAFER SEMICONDUCTOR SUBSTRATE
300a TAPE REEL
300b DICING TAPE
300c CHIP TRAY
310a, 310c POCKET
320b DICING RING
500 CAPACITOR CLUSTER

The invention claimed is:

1. A capacitor cluster comprising:
   a first capacitor;
   a second capacitor; and
   a holding body constructed to hold the first capacitor and the second capacitor, wherein
   each of the first capacitor and the second capacitor includes
      a semiconductor substrate having a main surface;
      a first electrode layer on a side of the main surface of the semiconductor substrate;
      a dielectric layer on the first electrode layer;
      a second electrode layer on the dielectric layer;
      a first outer electrode electrically connected to the first electrode layer; and
      a second outer electrode electrically connected to the second electrode layer,
   wherein the second capacitor has a shape different from a shape of the first capacitor in at least one of the first electrode layer, the second electrode layer, the first outer electrode, and the second outer electrode, and
   a stress distribution in a plane of the semiconductor substrate of the second capacitor is different than that of the first capacitor.

2. The capacitor cluster according to claim 1, wherein
   in each of the first capacitor and the second capacitor, when viewed from a side of the first outer electrode and the second outer electrode, at least one of the first electrode layer, the second electrode layer, the first outer electrode, and the second outer electrode has a first region having a rectangular shape and a maximum area and at least one second region that protrudes from the first region, and
   the second regions of the first capacitor and the second capacitor have shapes that are different from each other.

3. The capacitor cluster according to claim 1, wherein the first electrode layers of the first capacitor and the second capacitor have shapes that are different from each other.

4. The capacitor cluster according to claim 3, wherein the first electrode layers of the first capacitor and the second capacitor have a first region having a rectangular shape and a maximum area and at least one second region that protrudes from the first region, and the second regions of the first capacitor and the second capacitor have shapes that are different from each other.

5. The capacitor cluster according to claim 4, wherein the at least one second region protrudes from a short side of the first region.

6. The capacitor cluster according to claim 1, wherein the second electrode layers of the first capacitor and the second capacitor have shapes that are different from each other.

7. The capacitor cluster according to claim 6, wherein the second electrode layers of the first capacitor and the second capacitor have a first region having a rectangular shape and a maximum area and at least one second region that protrudes from the first region, and the second regions of the first capacitor and the second capacitor have shapes that are different from each other.

8. The capacitor cluster according to claim 7, wherein the second electrode layers of the first capacitor and the second capacitor have an H-shape.

9. The capacitor cluster according to claim 7, wherein the at least one second region protrudes from a short side of the first region.

10. The capacitor cluster according to claim 7, wherein the at least one second region protrudes from a long side of the first region.

11. The capacitor cluster according to claim 1, wherein at least one of the first outer electrode and the second outer electrode of the first capacitor and the second capacitor have shapes that are different from each other.

12. The capacitor cluster according to claim 1, wherein at least one of the first electrode layer, the second electrode layer, the first outer electrode, and the second outer electrode of the first capacitor and the second capacitor have areas that are different from each other when viewed from a side of the first outer electrode and the second outer electrode.

13. The capacitor cluster according to claim 12, wherein a thickness of the dielectric layer of the first capacitor and the second capacitor are different from each other.

14. The capacitor cluster according to claim 13, wherein the dielectric layer of the first capacitor is thicker than the dielectric layer of the second capacitor.

15. The capacitor cluster according to claim 14, wherein an area of the second electrode layer of the first capacitor is larger than an area of the second electrode layer of the second capacitor when viewed from the side of the first outer electrode and the second outer electrode.

* * * * *